(12) United States Patent
Howald

(10) Patent No.: US 6,259,334 B1
(45) Date of Patent: Jul. 10, 2001

(54) METHODS FOR CONTROLLING AN RF MATCHING NETWORK

(75) Inventor: Arthur M. Howald, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/218,542

(22) Filed: Dec. 22, 1998

(51) Int. Cl.[7] .................................. H01P 5/08; H03H 7/38
(52) U.S. Cl. ...................... 333/17.3; 333/32; 333/99 PL; 315/111.21
(58) Field of Search .................. 333/17.3, 32, 99 PL; 315/111.21

(56) References Cited

U.S. PATENT DOCUMENTS

| | | | |
|---|---|---|---|
| 3,941,966 | 3/1976 | Schatz | 219/10.49 |
| 5,187,454 | 2/1993 | Collins et al. | 333/17.3 |
| 5,463,526 | 10/1995 | Mundt | 361/234 |
| 5,589,844 | * 12/1996 | Belcher et al. | 343/860 |
| 5,609,720 | 3/1997 | Lenz et al. | 156/643.1 |
| 5,670,066 | 9/1997 | Barnes et al. | 219/121.58 |
| 5,671,116 | 9/1997 | Husain | 361/234 |
| 5,689,215 | 11/1997 | Richardson et al. | 333/17.3 |
| 5,708,250 | 1/1998 | Benjamin et al. | 219/121.58 |
| 5,737,175 | 4/1998 | Grosshart et al. | 361/234 |
| 5,793,162 | 8/1998 | Barnes et al. | 315/111.21 |
| 5,793,192 | 8/1998 | Kubly et al. | 323/312 |
| 5,798,904 | 8/1998 | Guyot | 361/234 |

OTHER PUBLICATIONS

M. Lieberman and A. Lichtenberg, "Principles of Plasma Discharges and Materials Processing", © 1994, Wiley–Interscience Publ., John Wiley & Sons, Inc.

* cited by examiner

Primary Examiner—Robert Pascal
Assistant Examiner—Kimberly E Glenn
(74) Attorney, Agent, or Firm—Martine & Penilla, LLP

(57) ABSTRACT

Disclosed are methods and devices for tuning an impedance matching network to a tune point where power reflection is at a minimum. The impedance matching network is coupled between an rf generator and a load to transmit rf power to the load. The impedance matching network includes a set of variable impedance elements. The method includes measuring a network impedance value of the impedance matching network including the load at current values of the variable impedance elements. The method further includes computing directions (i.e., increasing or decreasing) and relative rates of change for the variable impedance element values in response to the network impedance of the network such that the directions and relative rates of change for the variable impedance elements are adapted to change the reflected power in the direction of the most rapid decrease in reflected power. In addition, the method includes driving the variable impedance elements by adjusting the variable impedance elements in the computed directions by the computed relative rates of change such that the variable impedance elements are driven to new current values in the direction of the most rapid decrease in reflected power. The method also includes repeating operations (a) through (c) until a desired level of tuning precision is obtained at the current values of the variable impedance elements.

20 Claims, 13 Drawing Sheets

METHODS FOR CONTROLLING AN RF MATCHING NETWORK

BACKGROUND OF THE INVENTION

1. Field of the Invention

The present invention relates generally to the manufacture of semiconductor devices. More specifically, the present invention relates to improved methods and apparatus for tuning rf matching networks for a plasma processing chamber.

2. Description of the Related Art

Semiconductor processing systems are generally used to process semiconductor wafers for fabrication of integrated circuits. For example, plasmaenhanced semiconductor processes are commonly used in etching, oxidation, chemical vapor deposition, or the like. The plasma-enhanced semiconductor processes are typically carried out by means of plasma processing systems.

FIG. 1 illustrates a representative plasma processing system 100 for processing a semiconductor wafer 102. The plasma processing system 100 includes a plasma processing chamber 104, which is well known in the art. The processing chamber 104 includes an electrostatic chuck 112 for supporting and clamping the wafer 102 in place for plasma processing. The plasma processing system 100 also includes an rf generator 106 and an rf matching network 110 coupled to the rf generator 106 by means of a cable 108. The rf matching network 110 is coupled to deliver rf power from the rf generator 106 to the electrostatic chuck 112.

When the rf generator 106 is energized after a source gas (not shown) has been introduced into the chamber 104, a plasma 114 is created from the source gas. The wafer 102 is disposed over the electrostatic chuck 112 to be processed by the plasma. A heat transfer gas (e.g., helium) 116 may be provided to the wafer 102 under pressure via one or more ports 118 through the electrostatic chuck 112. The heat transfer gas 116 acts as a heat transfer medium between the wafer 102 and electrostatic chuck 112 to facilitate control of the wafer temperature during processing.

In this arrangement however, the rf power supplied to the plasma processing chamber 104 may be reflected back from the plasma processing chamber 104, thereby reducing the efficiency of the plasma processing system 100. The rf power reflection is generally caused by a mismatch in impedance of the rf generator 106 and a load formed by the plasma 114 and the chuck 112. The rf generator 106 has an output impedance $Z_0$, which is typically 50Ω. The cable 108 has a matching characteristic impedance equal to the output impedance of the rf generator 106. The plasma 114 and the chuck 112 together form the load characterized by a complex load impedance $Z_L$. If $Z_L$ is not equal to $Z_0^*$, which is the complex conjugate of $Z_0$, then an impedance mismatch exists between the generator and the load.

The rf matching network 1 10 is provided between the rf generator 106 and the plasma processing chamber 104 to minimize reflection of rf power from the plasma processing chamber 104. The rf matching network 110 typically includes two or more variable impedance elements (e.g., capacitors, inductors). The variable impedance elements may be tuned to provide an impedance $Z_M$ that matches the impedance of the rf generator 106.

FIG. 2 shows a circuit diagram of an exemplary rf matching network 110 coupled to the load 202, which is equivalent to the combination of the electrostatic chuck 112 and plasma 114. The rf matching network 110 includes a variable capacitor C1 coupled to an inductor L1 in series. The rf matching network 110 also includes a variable capacitor C2 coupled in series to an inductor L2. The variable capacitors C1 and C2 are coupled to each other at a junction A. The electrode and plasma load 202 is coupled in series with the inductor L2 and is coupled to a junction B.

In this configuration, the variable capacitors C1 and C2 may be tuned to provide an impedance $Z_M$ across the junctions A and B, which matches the impedance of the rf generator 106. The impedance, $Z_M$, represents the total impedance of the network 110 in combination with the load 202. Ideally, when the impedance $Z_M$ is equal to the output impedance of the rf generator 106, the rf power reflected is at zero percent.

For example, if the impedance of the rf generator 106 is 50Ω, then the magnitude and phase of complex impedance $Z_M$ need to be equal to 50Ω and zero degrees, respectively, in order to minimize power reflection. The set of values of the capacitors C1 and C2 at which the complex impedance $Z_M$ equals the output impedance of the rf generator 106 is referred to as a "tune" point or target point. Accordingly, the tune or target point is where the power reflection is at a minimum.

Several techniques are known for tuning variable impedance elements in an rf matching network. FIG. 3 illustrates a flow chart of a conventional method for tuning capacitors C1 and C2. The method starts in operation 302 and proceeds to operation 304, where the plasma processing system 100 including the rf generator 106 is activated. At this time, the capacitors C1 and C2 are usually not set properly to the tune point. Thus, some rf power is reflected back.

Then in operation 306, the magnitude and phase of $Z_M$ are determined by measuring a voltage V, a current I, and an angle θ between the voltage and current in accordance with well known equation $Z_M = |Z_M| e^{i\theta}$, with $|Z_M| = |V|/|I|$. In operation 308, it is determined whether the magnitude of $Z_M$ is equal to a tune point value, for example, of 50Ω. If not, the operation proceeds to operation 310, where the variable capacitor C2 is adjusted by means of a computer and DC motors to match the impedance of the rf generator 106. If the magnitude of impedance $Z_M$ is greater than the impedance of the rf generator 106, then the capacitance of C2 is increased. Conversely, if the magnitude of impedance of $Z_M$ is less than the impedance of the rf generator 106, then the capacitance of C2 is decreased.

After adjusting capacitor C2 in operation 310 or if magnitude is equal to the tune point in operation 308, the method proceeds to operation 312, where it is determined if the phase is equal to zero degrees. If the phase is determined to be non-zero, the method proceeds to operation 314, where capacitor C1 is adjusted to change the phase to reach the target impedance phase of zero degrees. For example, if the phase of the impedance $Z_M$ is less than zero, then the capacitance of C1 is increased. Conversely, if the phase is greater than zero, the capacitance of C1 is decreased. It should be noted that the variable capacitors C1 and C2 are adjusted by means of a computer and DC motors. Specifically, a computer may drive the DC motors to adjust the capacitance of the capacitors C1 and C2 so as to reach the target tune point.

After adjusting capacitor C1 in operation 314 or if the phase is equal to zero in operation 312, the method proceeds to operation 316, where it is determined whether the plasma processing is complete. If so, the method terminates operation 318. Otherwise, the method proceeds back to operation 306 to continue tuning the capacitors C1 and C2 in the continually varying conditions (e.g., varying load, drifting tuning motors) of the plasma processing system.

Unfortunately, the method described in FIG. 3 may not efficiently tune the capacitors to the target point for certain ranges of capacitance values. The problem is illustrated more clearly in FIGS. 4A and 4B. FIG. 4A illustrates an exemplary graph 400 plotting the magnitude 402 of impedance $Z_M$ and reflected power 404 as a function of the value of capacitor C2 for capacitor C1 held fixed at its tune value. The tune value of capacitor C2 is about 231 pF.

A line 406 indicates the impedance tune value of 50Ω. The magnitude 402 and the tune line 406 intersect at points 408 and 410. The point 410 represents the tune point at which the power reflected is at a minimum while the point 408 corresponds to a capacitance value of about 255 pF. At capacitance C2 values of less than 255 pF, the tuning method of FIG. 3 works efficiently by increasing C2 if $|Z_M|$ is greater than 50Ω and decreasing C2 if $|Z_M|$ is less than 50Ω. However for C2 values above 255 pF of point 408, the above method adjusts the value of C2 in the wrong direction. For instance at C2 values above 255 pF, the method increases C2 even though C2 is already above its tune value, thereby moving away from the tune point.

Similarly, the method of FIG. 3 does not efficiently tune the impedance angle θ in some range of C1 values. FIG. 4B shows a graph 450 plotting the phase θ 452 of the impedance $Z_M$ and reflected power 454 as a function of the capacitor C1. In the graph 450, the capacitor C2 is held fixed at its tune value of 231 pF. A tune line 456 represents the θ value of zero degrees. The phase line 452 and the tune line 456 intersect at points 458 and 460. The point 460 represents a tune point where the power reflected is at a minimum. The value of C1 at the point 460 is about 837 pF, The point 458 corresponds to a capacitance value of about 800 pF. At C1 values of greater than the capacitance at the point 458, the method of FIG. 3 will increase C1 if θ is smaller than 0 degrees and decrease C1 if θ is larger than 0 degrees. However, for C1 values below the capacitance at the point 458, the method decreases C1 even though C1 is already below its tune value. Hence, the method adjusts C1 in the wrong direction. Thus, by adjusting C1 and C2 values into wrong directions for certain capacitance value ranges, the method may never find tune point or may substantially delay the determination of the tune point.

Another method for controlling a matching network is described in U.S. Pat. No. 5,689,215 by Richardson et al., which is incorporated herein by reference. This method physically changes the values of C1 and C2 in a prescribed order and measures the percentage of reflected power as a function of capacitor value as each capacitor is varied. In so doing, the method finds two pairs of values (C1, C2) that correspond to local minima in the reflected power. A straight line connecting these two pairs of values points generally toward the true tune point. The method varies the values of C1 and C2 to follow the straight line. This process is then repeated until the desired level of reflected power is obtained.

While the method described in U.S. Pat. No. 5,689,215 works well, it may require substantial time to find a tune point. This is because physically varying the capacitors generally requires more time than computer implemented calculations.

U.S. Pat. No. 5,793,162 by Barnes et al., which is incorporate herein by reference, also describes a technique for controlling matching network of a vacuum plasma processor. The technique for controlling a matching network also relies on measurements of reflected power. Specifically, the technique involves varying a capacitor in one direction. If the reflected power increases, the adjustment direction of the capacitor is reversed. On the other hand, if the reflected power decreases, the adjustment direction of the capacitor remains the same as long as the reflected power continues to decrease. While this technique works well, it may not produce tune points in a speedy manner. For example, the reversals of directions may further add to the time required to find the tune point.

Yet another method for tuning a matching network using a predictor-corrector control system is described in U.S. Pat. No. 5,187,454 by Collins et al., which is incorporated herein by reference. This method involves estimating the values of matching network values at their tuned condition and moving the network values toward the estimated tune position. Unfortunately, this method also adjusts the variable impedance elements of the match network in the wrong directions under some circumstances. This can occur, for example, when the load impedance is not constant but is itself a rapidly varying function of the values of the variable impedance elements.

In view of the foregoing, what is needed are methods and systems for more rapidly and stably tuning an rf matching network to deliver maximum power to a vacuum plasma processing chamber.

SUMMARY OF THE INVENTION

Broadly speaking, the present invention fills these needs by providing methods and systems for tuning an rf matching network. It should be appreciated that the present invention can be implemented in numerous ways, including as a process, an apparatus, a system, a device, a method, or a computer readable medium. Several inventive embodiments of the present invention are described below.

In accordance with one embodiment, the present invention provides a method for tuning an impedance matching network toward a tune point where power reflection is at a minimum. The impedance matching network is coupled between an rf generator and a load to transmit rf power to the load. The impedance matching network includes a set of variable impedance elements. The method includes (a) measuring a network impedance value of the impedance matching network including the load at current values of the variable impedance elements; (b) computing directions (i.e., increasing or decreasing) and relative rates of change for the variable impedance element values in response to the network impedance of the network such that the directions and relative rates of change for the variable impedance elements are adapted to change the reflected power in the direction of the most rapid decrease in reflected power; (c) driving the variable impedance elements by adjusting the variable impedance elements in the computed directions by the computed relative rates of change such that the variable impedance elements are driven to new current values in the direction of the most rapid decrease in reflected power; and (d) repeating operations (a) through (c) until a desired level of tuning precision is obtained at the current values of the variable impedance elements.

In another embodiment, the present invention provides a method for tuning an impedance matching network to a tune point where power reflection is at a minimum. The impedance matching network is coupled between an rf generator and a load to transmit rf power to the load. The impedance matching network includes a set of variable impedance elements. The method includes measuring a network impedance value of the impedance matching network including the load at current values of the variable impedance elements. The method also includes computing a load impedance in response to the network impedance value and the variable impedance element values. In addition, the method includes determining a tune equation adapted to approximate a tune line through the tune point. The tune line includes a plurality of sets of values for the variable impedance elements. Furthermore, the method includes adjusting the impedance element values so as to reach a nearest set of values for the variable impedance elements on the tune line. The method further includes adjusting the impedance element values along the tune line in the direction of decreasing reflected power.

In yet another embodiment, the present invention provides a system for tuning an impedance matching network to a tune point where power reflection is at a minimum. The system includes an rf generator, a cable, an impedance matching network, and an impedance tuning apparatus. The rf generator is adapted to generate rf power and has an impedance value of $Z_0$. The cable is coupled to the rf generator to transmit the rf power and also has the characteristic impedance value of $Z_0$. The impedance matching network is coupled to receive the rf power for delivery to a load and includes a set of variable impedance elements that are capable of being tuned. The impedance tuning apparatus is coupled to tune the impedance matching network. The impedance tuning apparatus including means for measuring a network impedance value of the impedance matching network including the load at current values of the variable impedance elements. The impedance tuning apparatus further includes means for determining directions and relative rates of change for the variable impedance element values in response to the network impedance of the network such that the directions and relative rates of change for the variable impedance elements are adapted to change the reflected power in the direction of the most rapid decrease in reflected power. Additionally, the impedance tuning apparatus includes means for driving the variable impedance elements by adjusting the variable impedance elements in the computed directions by the computed relative rates of change such that the variable impedance elements are driven to new current values in the direction of the most rapid decrease in reflected power. The driving means is adapted to adjust the variable impedance elements until a desired level of power reflection is obtained.

In accordance with yet another embodiment, the present invention provides a system for tuning an impedance matching network to a tune point where power reflection is at a minimum. The system includes an rf generator, a cable, an impedance matching network, and an impedance tuning apparatus. The rf generator is adapted to generate rf power and is characterized by an impedance value of $Z_0$. The cable is coupled to the rf generator to transmit the rf power and also has the impedance value of $Z_0$. The impedance matching network is coupled to receive the rf power for delivery to a load and includes a set of variable impedance elements that are capable of being tuned. The impedance tuning apparatus is coupled to tune the impedance matching network. The impedance tuning apparatus includes means for measuring a network impedance value of the impedance matching network including the load at a set of current values of the variable impedance elements. The impedance tuning apparatus also includes means for computing a load impedance in response to the network impedance value and the variable impedance element values. In addition, the impedance tuning network includes means for determining a tune equation adapted to approximate a tune line through the tune point, the tune line including a plurality of sets of values for the variable impedance element values. Furthermore, the impedance tuning network includes means for adjusting the impedance element values so as to reach a nearest set of values for the variable impedance elements on the tune line. Additionally, the impedance tuning network includes means for adjusting the impedance element values along the tune line in the direction of decreasing reflected power.

Advantageously, the present invention tunes the rf matching network in the direction of the steepest decrease in reflected power so that substantial time is saved in approaching the tune point. In addition, the methods and systems of the present invention calculate the correct directions in which to change the variable impedance elements without requiring time-consuming preliminary physical movements of the elements. These and other advantages of the present invention will become apparent upon reading the following detailed descriptions and studying the various figures of the drawings.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described herein for methods and systems for tuning an rf matching network. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

Figure 5:
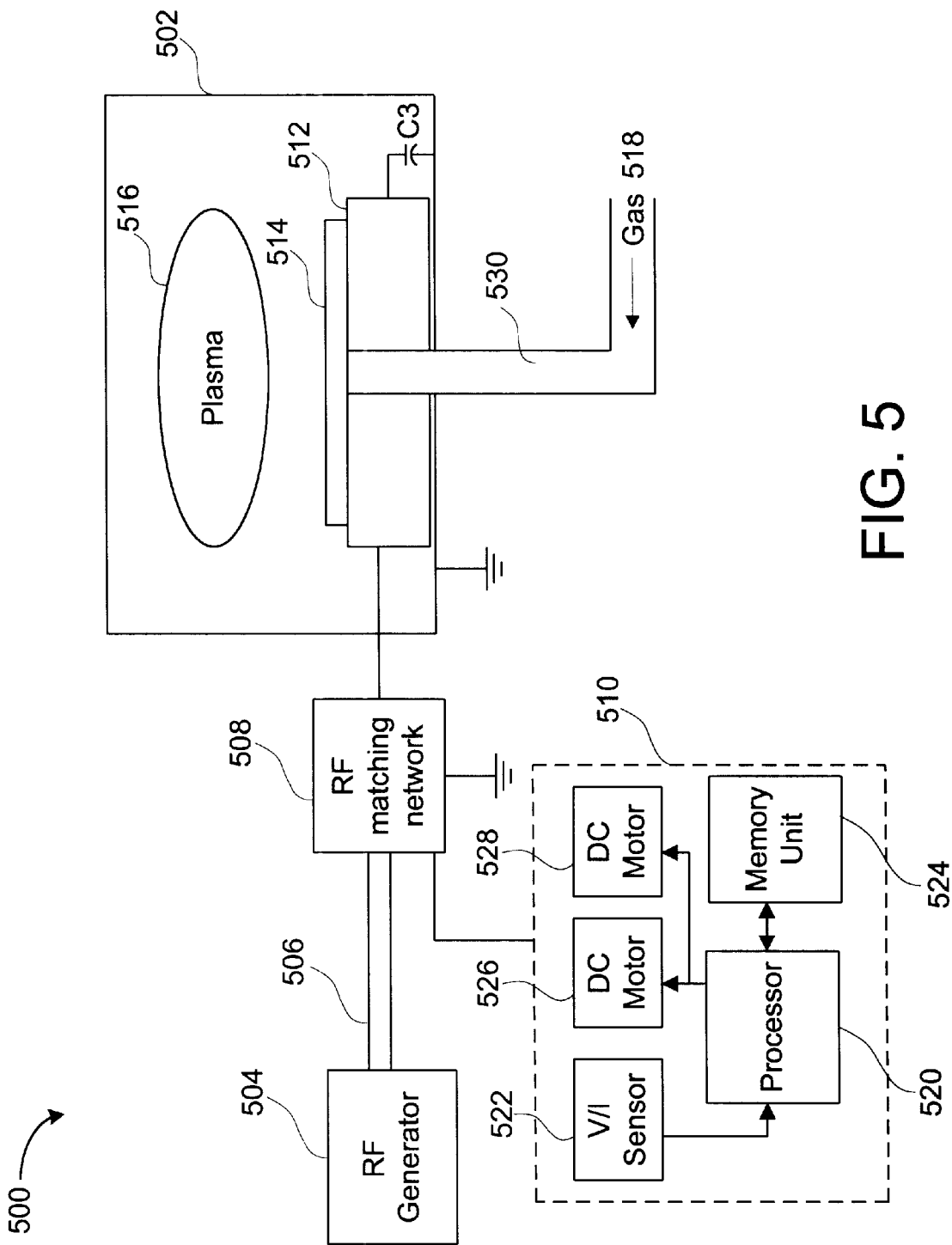
FIG. 5 illustrates an exemplary plasma processing system 500 for processing a semiconductor wafer 502 in accordance with one embodiment of the present invention.

FIG. 5 illustrates an exemplary plasma processing system 500 for processing a semiconductor wafer 514 in accordance with one embodiment of the present invention. The plasma processing system 500 includes a plasma processing chamber 502, rf generator 504, a cable 506, an rf matching network 508, and an impedance tuning apparatus 510. The rf generator 504 generates rf power for transmission through the cable 506. The cable 506 is coupled between the rf generator 504 and the rf matching network 508 for transmitting rf power to the plasma processing chamber 502 through the rf matching network 508. The impedance tuning device 510 is coupled to the rf matching network 508 for tuning variable elements in the rf matching network 508 toward a tune point.

The plasma processing chamber 502 is coupled to the rf matching network 508 to receive the rf power. The plasma processing chamber 502 includes an electrostatic chuck 512 for supporting and clamping a wafer 514 in place for plasma processing. The rf matching network 508 is coupled to deliver rf power from the rf generator 504 to the electrostatic chuck 512, which functions as an electrode. As used herein in describing the invention, the terms electrode and electrostatic chuck are used interchangeably. The walls of the chamber 502 are grounded.

The impedance tuning apparatus 510 includes a processor 520, a voltage/current (V/I) sensor 522, a memory unit 524, and one or more motors 526, 528 for driving variable elements in the rf matching network 508. The V/I sensor 522 measures a voltage and a current in the rf matching network. The processor 520 is coupled to receive the voltage and current from the V/I sensor to compute magnitude and phase of the impedance of the matching network 508 using the memory unit 524. In response to the computed magnitude and phase, the processor 520 drives the motors 526, 528 to drive the variable elements in the rf matching network 508 to the tune point. It should be appreciated that the impedance tuning apparatus 510 may include any suitable number of motors to drive any number of variable elements in the rf matching network 508. Preferably, one motor is provided for each variable element.

When the rf generator 504 is energized after a source gas (not shown) has been introduced into the chamber 502, a plasma 516 is created from the source gas. The wafer 514 is disposed over the electrostatic chuck 512 to be processed by the plasma. A heat transfer gas (e.g., helium) 518 may be provided to the wafer 514 under pressure via one or more ports 530 through the electrostatic chuck 512. The heat transfer gas 518 acts as a heat transfer medium between the wafer 514 and the electrostatic chuck 512 to facilitate control of the wafer temperature during processing. An optional capacitor C3 may be provided between the electrode and the ground.

In this arrangement, the rf generator 504 is characterized by an output impedance $Z_0$ (e.g., 50Ω). The cable 506 has a characteristic impedance equal to the output impedance $Z_0$ of the rf generator 504. The plasma 516 and the electrode 512 together form a load characterized by load impedance $Z_L$. Maximum power is transferred from the generator to the load when the impedance of the load $Z_L$ is equal to the complex conjugate of the impedance of the generator, $Z_0^*$. In general, this condition is not satisfied and an impedance mismatch exists between the generator and the load.

Figure 6:
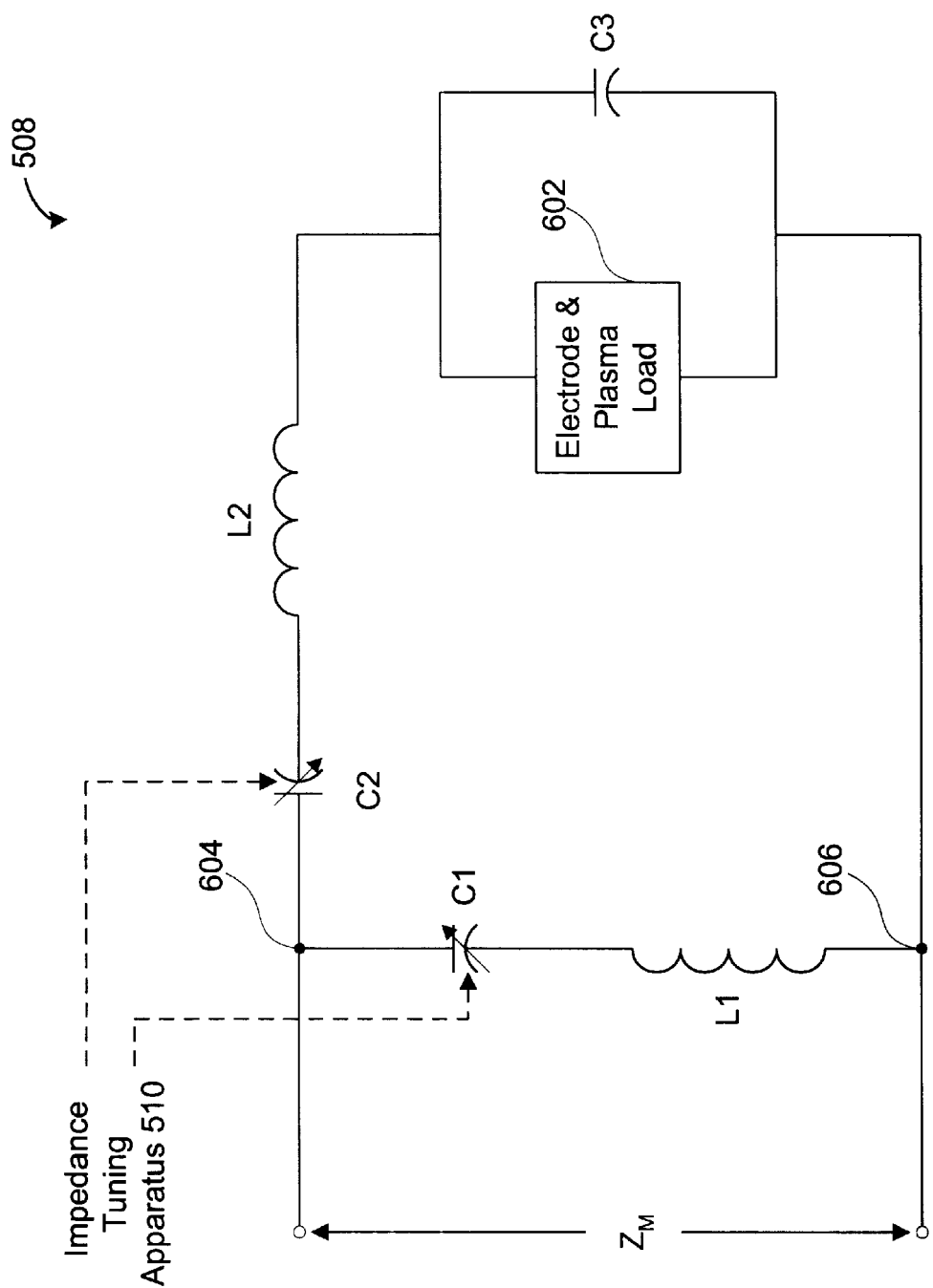
FIG. 6 shows a more detailed circuit diagram of the rf matching network coupled to a load in accordance with one aspect of the present invention.

The rf matching network 508 functions to minimize reflection of rf power from the plasma processing chamber 502. FIG. 6 shows a more detailed circuit diagram of an exemplary rf matching network 508 coupled to a load 602. The load 602 is equivalent to the load combination of the electrode 512 and plasma 516.

The rf matching network 508 includes a variable capacitor C1 coupled to an inductor L1 in series. The rf matching network 508 also includes a variable capacitor C2 coupled in series to an inductor L2. The variable capacitors C1 and C2 are coupled to each other at a junction 604. The electrode and plasma load 602 is coupled in parallel with the capacitor C3. The combination of the load 602 and the capacitor C3 is coupled in series with the inductor L2. In addition, the load 602 and the capacitor C3 are coupled to the inductor L1 at a junction 606. The variable capacitors C1 and C2 are driven by the motors 526 and 528, respectively, to desired settings. It should be appreciated that the rf matching network 508 may include any suitable number of variable impedance elements such as capacitors, inductors, and the like.

In operation, the impedance tuning apparatus 510 tunes the variable capacitors C1 and C2 to provide matching impedance $Z_M$ which equals the complex conjugate of the impedance of the rf generator 504. Preferably, the impedance tuning apparatus 510 adjusts the variable capacitors C1 and C2 until the impedance $Z_M$ equals the output impedance of the rf generator 504 such that the rf power reflected is at a minimum. For example, if the impedance of the rf generator 504 is 50Ω, then the variable capacitors are adjusted until the magnitude and phase of complex impedance $Z_M$ are equal to 50Ω and zero degrees, respectively.

Given a measurement of the match impedance $Z_M$ for values C1 and C2 of the tuning capacitors C1 and C2, the impedance of the load $Z_L$ and the match impedance $Z'_M$ and reflected power $P'_R$ for any other near-by capacitor values C1' and C2' can be computed. Furthermore, the gradient $\vec{\nabla}$ of the reflected power as a function of C1 and C2 can also be determined by well known differentiation. In particular, the geometric interpretation of the gradient of the reflected power is a vector, which is perpendicular to the contours of constant reflected power and pointing toward higher reflected power. By repeatedly computing the negative gradient of reflected power and varying the capacitors in that direction, the tune point can be found along the path of the steepest descent.

As an example, for the particular circuit arrangement of FIG. 6, the load impedance $Z_L$ can be calculated from the measured match impedance and the known values of C1 and C2 by the relationship:

$$Z_L = [Z_1 Z_2 - Z_M(Z_1 + Z_2)]/(Z_M - Z_1), \quad \text{Equation (1)}$$

where $Z_1$ is the sum of the (complex) impedances of C1 and L1, $Z_2$ is the sum of the impedance of C2 and L2, and $Z_M$ is the measured impedance between junctions 604 and 606.

Assuming a constant load impedance, the match impedance $Z_M'$ for any other pair of values C1' and C2' can then be calculated:

$$Z_M'=(Z_L+Z_2')Z_1'/(Z_1'+Z_2'+Z_L) \qquad \text{Equation (2)}$$

The ratio of the reflected to incident rf powers is:

$$P_{reflected}/P_{incident}=[(R_M-R_0)^2+X_M^2]/[(R_M+R_0)^2 X_M^2], \qquad \text{Equation (3)}$$

where $R_M$ and $X_M$ are the real and imaginary parts of $Z_M$, and $R_0$ is 50Ω. It should be appreciated that the tuning methods and systems of the present invention may be used with any suitable impedance matching circuits including any number of impedance elements.

Figure 7A:
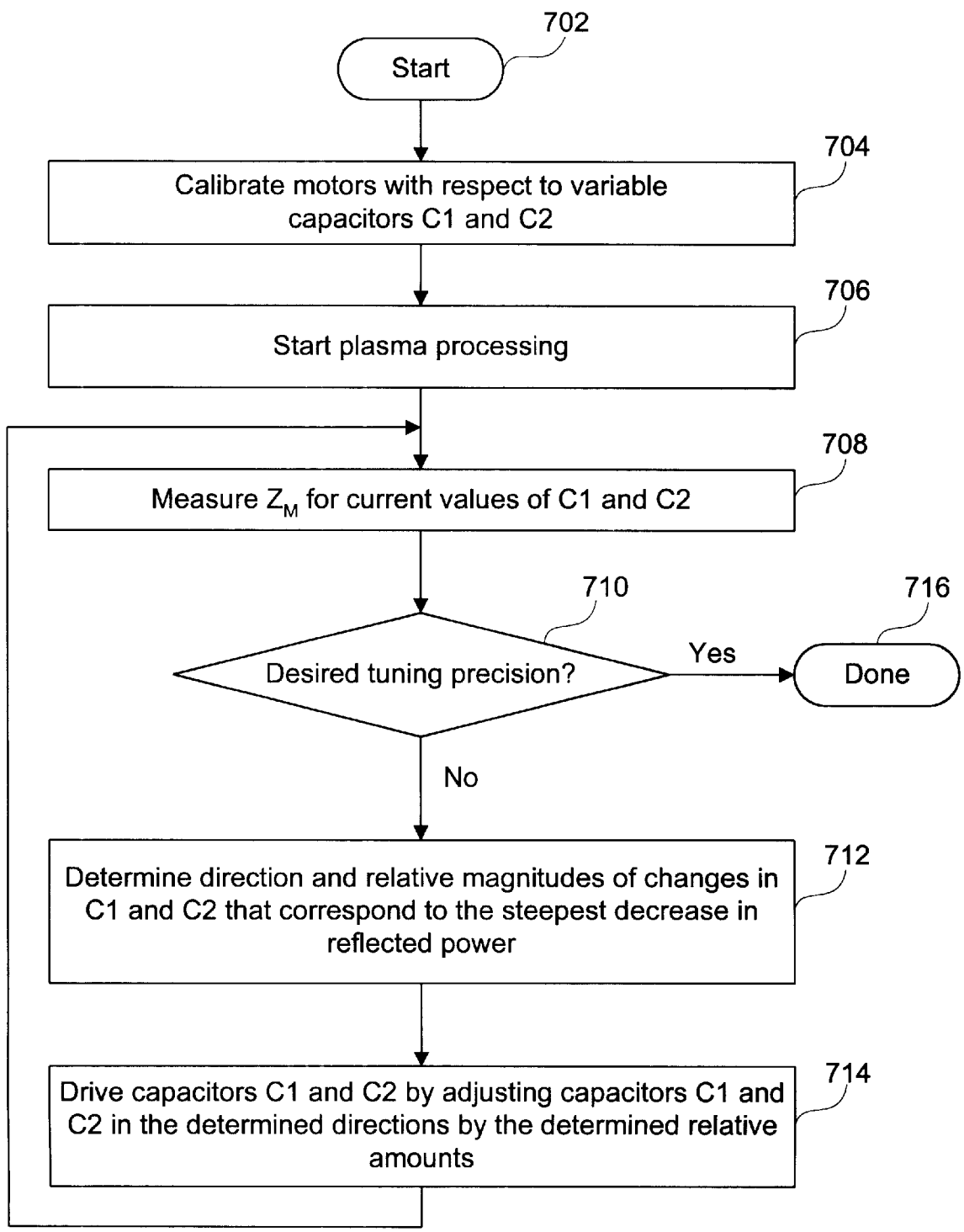
FIG. 7A illustrates a flowchart of a method performed by the impedance tuning apparatus 510 for tuning the rf matching network 508 in accordance with one embodiment of the present invention.

FIG. 7A illustrates a flowchart of an exemplary method performed by the impedance tuning apparatus 510 for tuning the rf matching network 508 in accordance with one embodiment of the present invention. The method starts in operation 702 and proceeds to operation 704, where the motors 526 and 528 are calibrated to determine precise relationship between steps or rotations of the motors 526, 528 with respect to capacitance values of the variable capacitors C1 and C2. For example, capacitance values of C1 and C2 may be calibrated in relation to to counts of DC stepper motors. Preferably, the values of L1 and L2 are also be determined by measurement at this time. Although the present invention employs the motors 526 and 528, it may utilize any number of motors to drive any suitable number of impedance elements such as capacitors, inductors, and the like.

In operation 706, plasma processing begins by activating, for example, the plasma processing system 500. Then in operation 708, the impedance $Z_M$ is measured at some current values of C1 and C2. In operation 710, it is determined whether a desired tuning precision is obtained at the current values of C1 and C2. In one embodiment, the tuning precision is determined with respect to a predetermined level of reflected power. For example, a reflected power percentage corresponding to the current values of C1 and C2 are computed and compared with the predetermined reflected power level. If the reflected power percentage at the current values of C1 and C2 are within the predetermined reflected power level, the method proceeds to operation 716, where the method terminates.

Alternatively, the tuning precision may be determined with respect to a predetermined magnitude and phase range of the impedance $Z_M$. For instance, the magnitude and phase of the measured $Z_M$ may be compared with the predetermined impedance magnitude and phase range. If the magnitude and phase of the measured $Z_M$ are within the predetermined impedance magnitude and phase range, then the method proceeds to operation 716, where the method terminates.

On the other hand, if the reflected power percentage at the current values of C1 and C2 are not within the predetermined reflected power level, the method proceeds to operation 712, where directions and relative magnitudes of changes in C1 and C2 that correspond to the steepest decrease in reflected power are determined. Direction as used herein refers to increase or decrease in capacitance values of C1 and/or C2. Relative magnitudes of changes in C1 and C2 refer generally to changing the capacitance value of one capacitor more quickly or slowly than changing the value of the other capacitor.

In one embodiment, the direction toward a lowest power reflection is determined from a plurality of sets of (C1, C2) that are in the neighborhood of the previous values of the variable capacitors. In another embodiment, the direction is determined by taking a negative gradient of reflected power defined in terms of C1 and C2.

In operation 714, the variable capacitors C1 and C2 are adjusted in the determined directions by the determined relative amounts such that they are driven to new current values. Then, the method proceeds back to operation 708, the impedance $Z_M$ is measured at the new current values of C1 and C2.

Figure 7B:
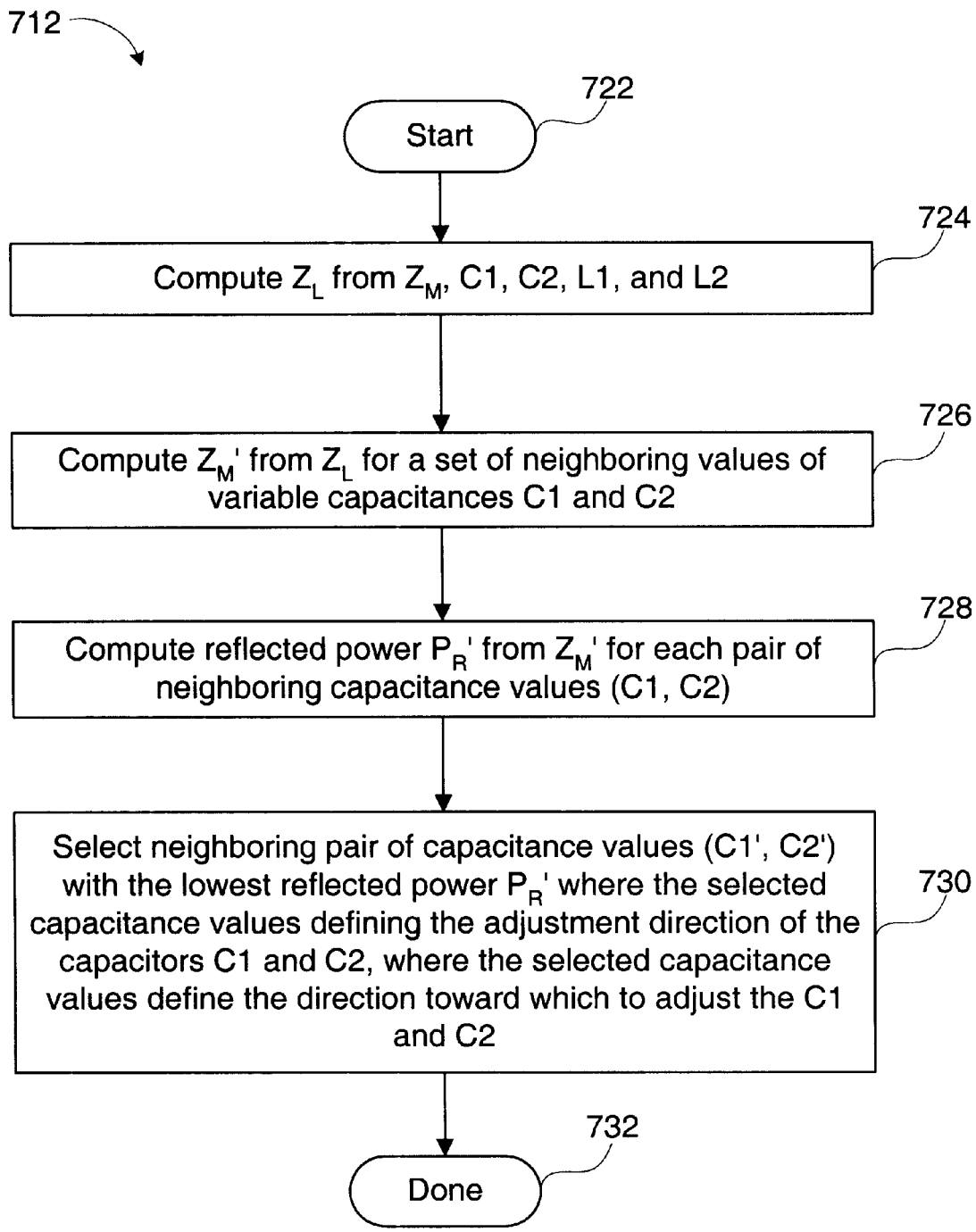
FIG. 7B shows a more detailed flowchart of an operation of determining an intermediate set of values for the variable capacitors C1 and C2 in accordance with one embodiment of the present invention.

FIG. 7B shows a more detailed flowchart of the operation 712 of determining directions and relative magnitudes for changes in the variable capacitors C1 and C2 in accordance with one embodiment of the present invention. The operation 712 begins in operation 722 and proceeds to operation 724, where the load impedance $Z_L$ is computed from the known values of $Z_M$, C1, C2, L1, and L2. Then, impedance values $Z_M'$ are computed from $Z_L$ at a set of neighboring C1' and C2' values in operation 726. The set of neighboring C1' and C2' values (e.g. eight) are selected from the vicinity of the previous current C1 and C2 values. Preferably, the neighboring C1' and C2' values are evenly distributed around, and substantially equidistant from, the previous current C1 and C2 values. Then in operation 728, reflected power $P_R'$ is computed from $Z_M'$'s for each of the neighboring values of C1' and C2'. The impedance tuning apparatus 510 then selects the neighboring values of C1' and C2' with the lowest reflected power PR' in operation 730. The selected neighboring values of C1' and C2' define the direction and relative magnitudes by which to change C1 and C2. The operation 712 then terminates in operation 732.

Figure 7C:
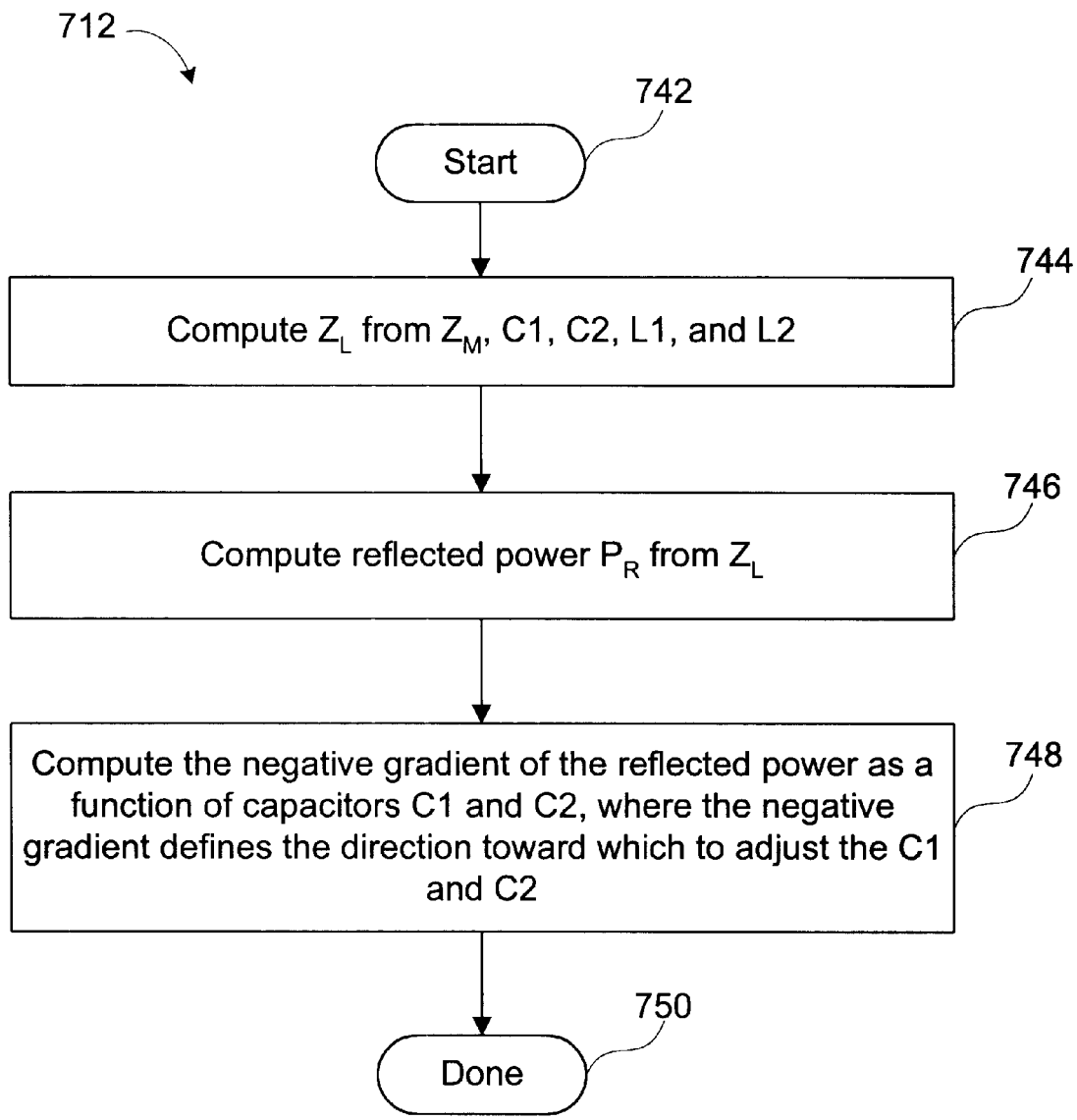
FIG. 7C illustrates a more detailed flowchart of an operation of determining an intermediate set of values for the variable capacitors C1 and C2 in accordance with another embodiment of the present invention.

FIG. 7C illustrates a more detailed flowchart of the operation 712 of determining directions and relative magnitudes for changes in the variable capacitors C1 and C2 in accordance with another embodiment of the present invention. The operation 712 begins in operation 742 and proceeds to operation 744, where a load impedance $Z_L$ is computed from $Z_M$, C1, C2, L1, and L2. Then in operation 746, reflected power $P_R$ is computed from $Z_L$. Then in operation 746, a negative gradient, $-\vec{g}(C1, C2)$, of the reflected power is computed as a function of capacitors C1 and C2. For example, the gradient function $\vec{g}(C1, C2)$ of $P_R$ may be defined in terms of C1 and C2 in the form of $\vec{g}=\vec{\nabla} \cdot P_R(C1, C2)$. The negative gradient defines the directions and relative magnitudes by which to change C1 and C2. The operation 712 then terminates in operation 750.

Figure 8:
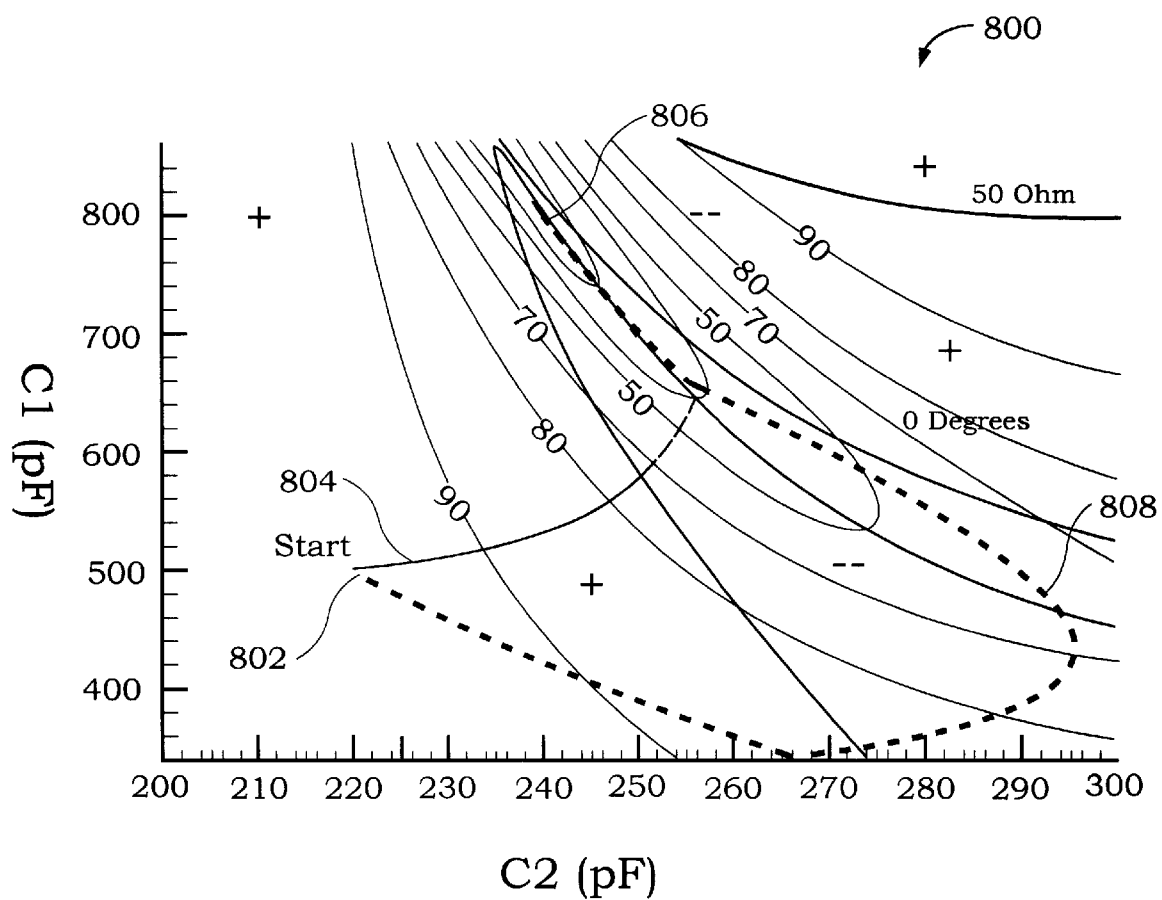
FIG. 8 shows a graph of a pair of tuning paths.

FIG. 8 shows a graph of a pair of tuning paths 804 and 808. The tuning path 804 is obtained by implementing the method of FIG. 7A. The tuning path 804 starts at a start point 802 and moves along the negative gradient of the reflected power toward the tuning point 806. In contrast, the tuning path 808 represents a path obtained by implementing the conventional method of FIG. 3. The tuning path 808 starts and ends at the same points 802 and 806. However, the tuning path 808 takes substantially more time to reach the tuning point because both C1 and C2 are adjusted by a significant amount in the wrong direction.

The method illustrated in FIGS. 7A, 7B, and 7C represents the values of C1 and C2 as being independently variable quantities. However, there is often a simple relationship between the two values C1 and C2 at the tuned condition. For example, the matching network of FIG. 6 is approximately a resonant circuit when it is properly tuned. That places an approximate relationship on the capacitors C1 and C2: $X_{C1}+X_{C2}=-X_{Remainder}$, where $X_{C1}$ and $X_{C2}$ are the capacitive reactances of the two capacitors and $X_{Remainder}$ is the equivalent reactance of all other components in the electrical loop (L1, L2, C3, and the Load). It is noted that since L1, L2, and C3 are known, and the impedance of the load can be calculated from the measured match impedance, the relationship between C1 and C2 can be made quite specific. That is, given one capacitance value, the other capacitance value can be determined.

Figure 9:
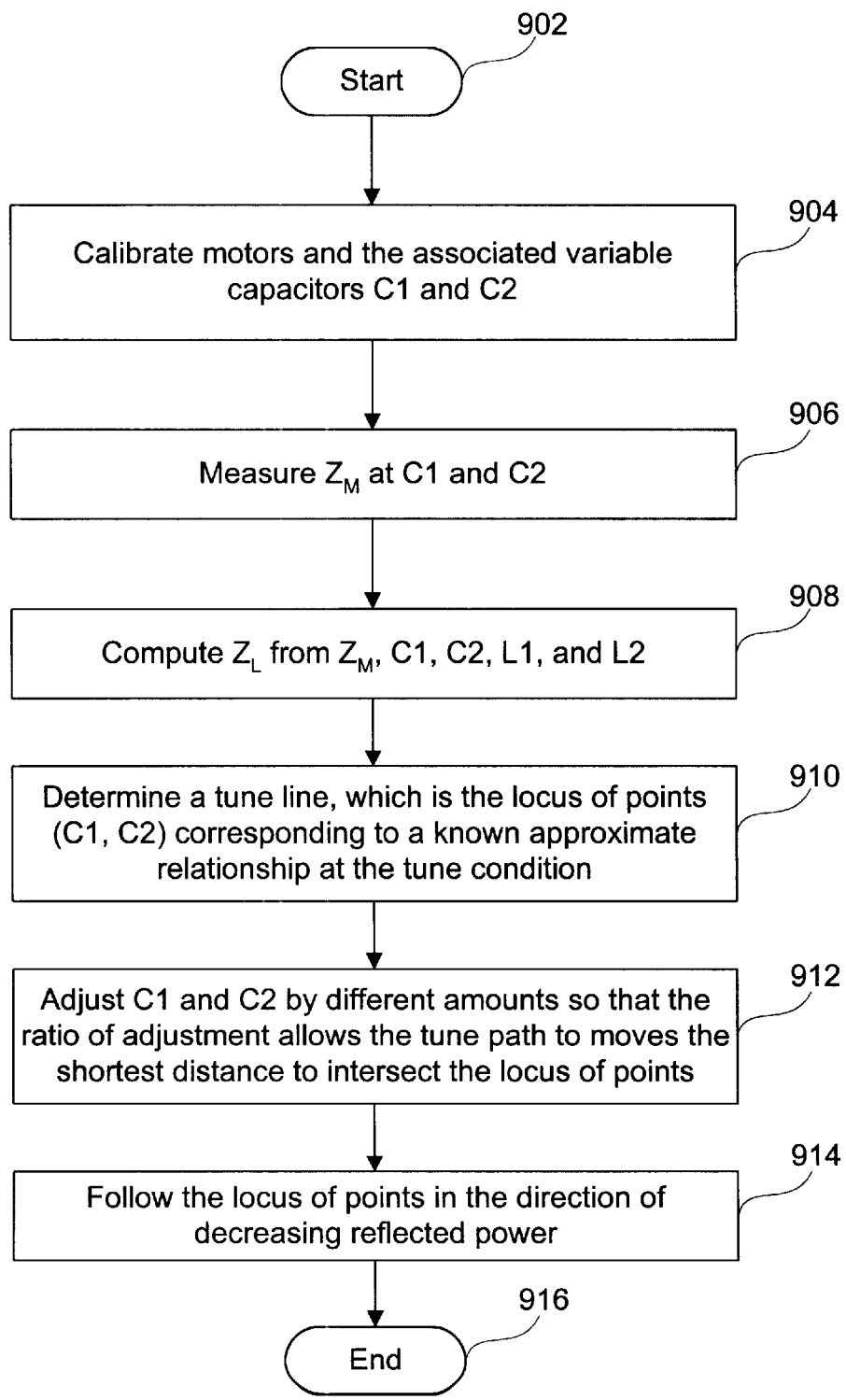
FIG. 9 illustrates a flowchart of a method performed by the impedance tuning apparatus for tuning the matching network in accordance with one embodiment of the present invention.

FIG. 9 illustrates a flowchart of a method performed by the impedance tuning apparatus 510 for tuning the matching network 508 in accordance with one embodiment of the present invention. The method begins in operation 902 and proceeds to operation 904, where the motors 526 and 528 are calibrated to determine precise relationship between steps or rotations of the motors 526, 528 and the capacitance values of the variable capacitors C1 and C2. In addition, the values of L1 and L2 may also be determined by measurement at this time.

In operation 906, the impedance tuning apparatus 510 measures the impedance $Z_M$ at some C1 and C2 values. Then in operation 908, the load impedance $Z_L$ is computed from the known values of $Z_M$, C1, C2, L1, and L2. The impedance tuning apparatus 510 next, in operation 910, determines a tune line, which is the locus of points (C1, C2) corresponding to a known approximate relationship at the tune condition. Then in operation 912, C1 and C2 are adjusted by different amounts so that the ratio of adjustment allows the tune path to move the shortest distance to intersect the locus of points. In operation 914, the impedance tuning apparatus 510 adjusts C1 and C2 to follow the locus of points in the direction of decreasing reflected power. The method then terminates in operation 916.

Figure 10:
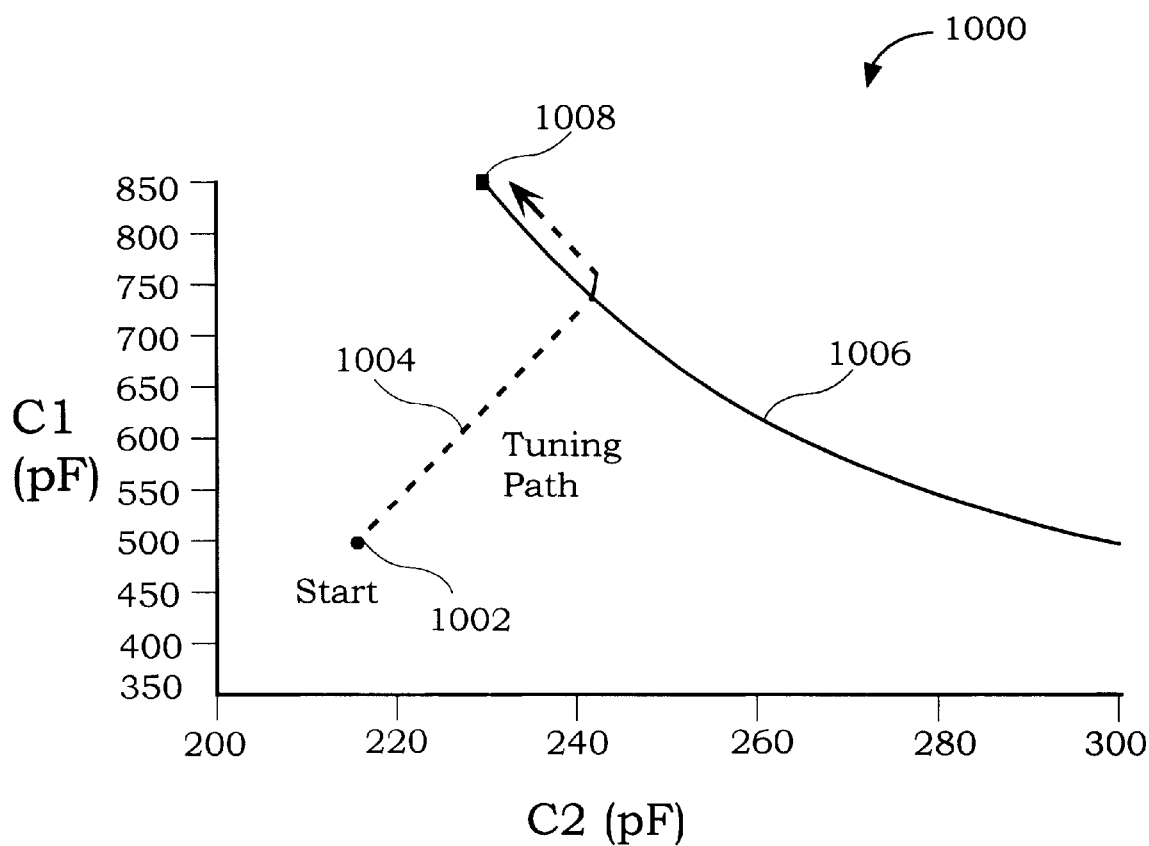
FIG. 10 shows a graph of a tuning path obtained by the method described in FIG. 9.

FIG. 10 shows a graph 900 of a tuning path 904 obtained by the method described in FIG. 9. The tune value 1008 of C1 and C2 is estimated to lie somewhere near a tune line 1006. From starting point 1002, the impedance tuning apparatus 510 varies the capacitors C1 and C2 to intersect the tune curve 1006 and then to move along the curve 1006 to find the tune point 1008.

Figure 1:
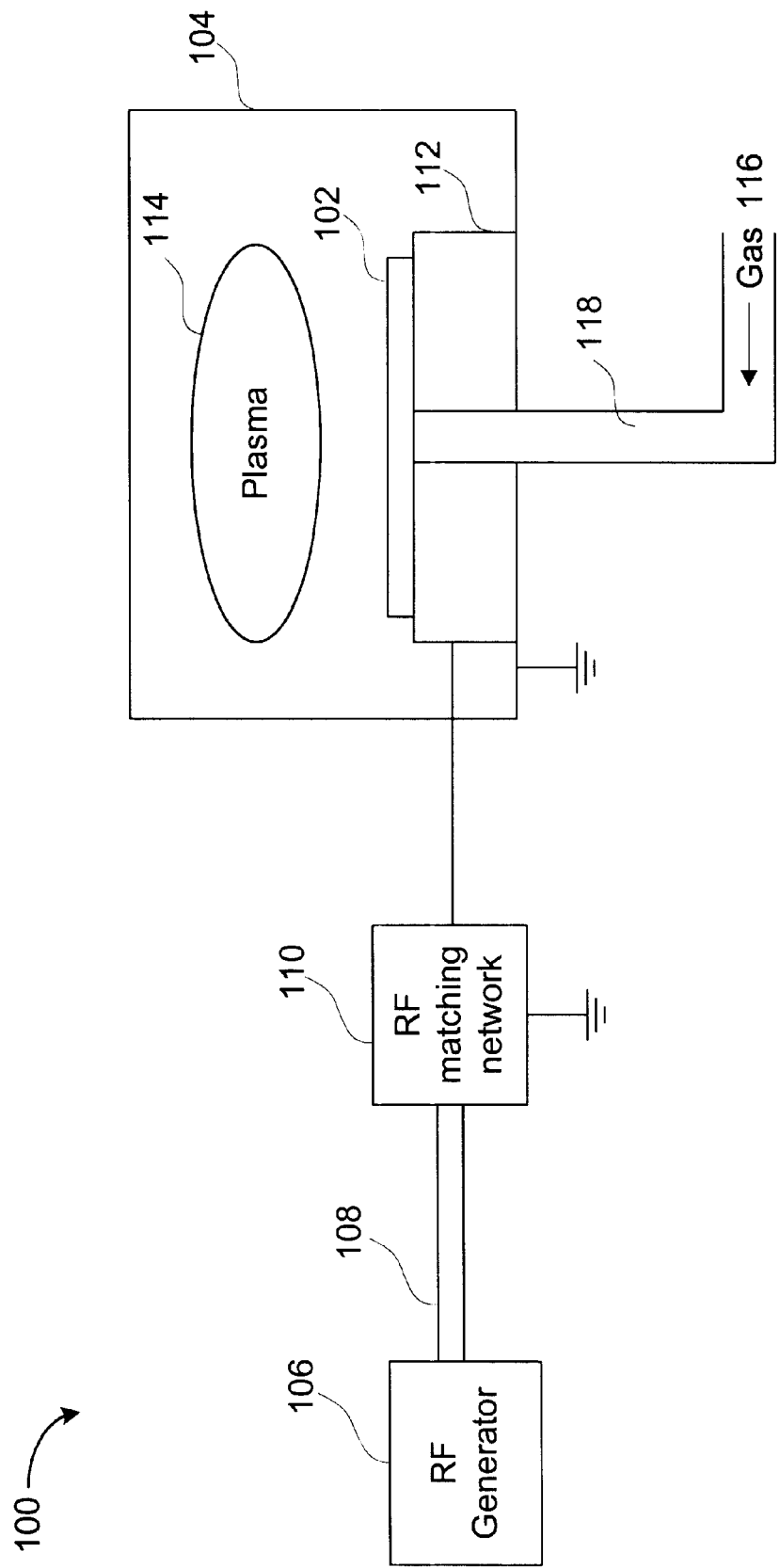
FIG. 1 illustrates a representative plasma processing system for processing a semiconductor wafer.
Figure 2:
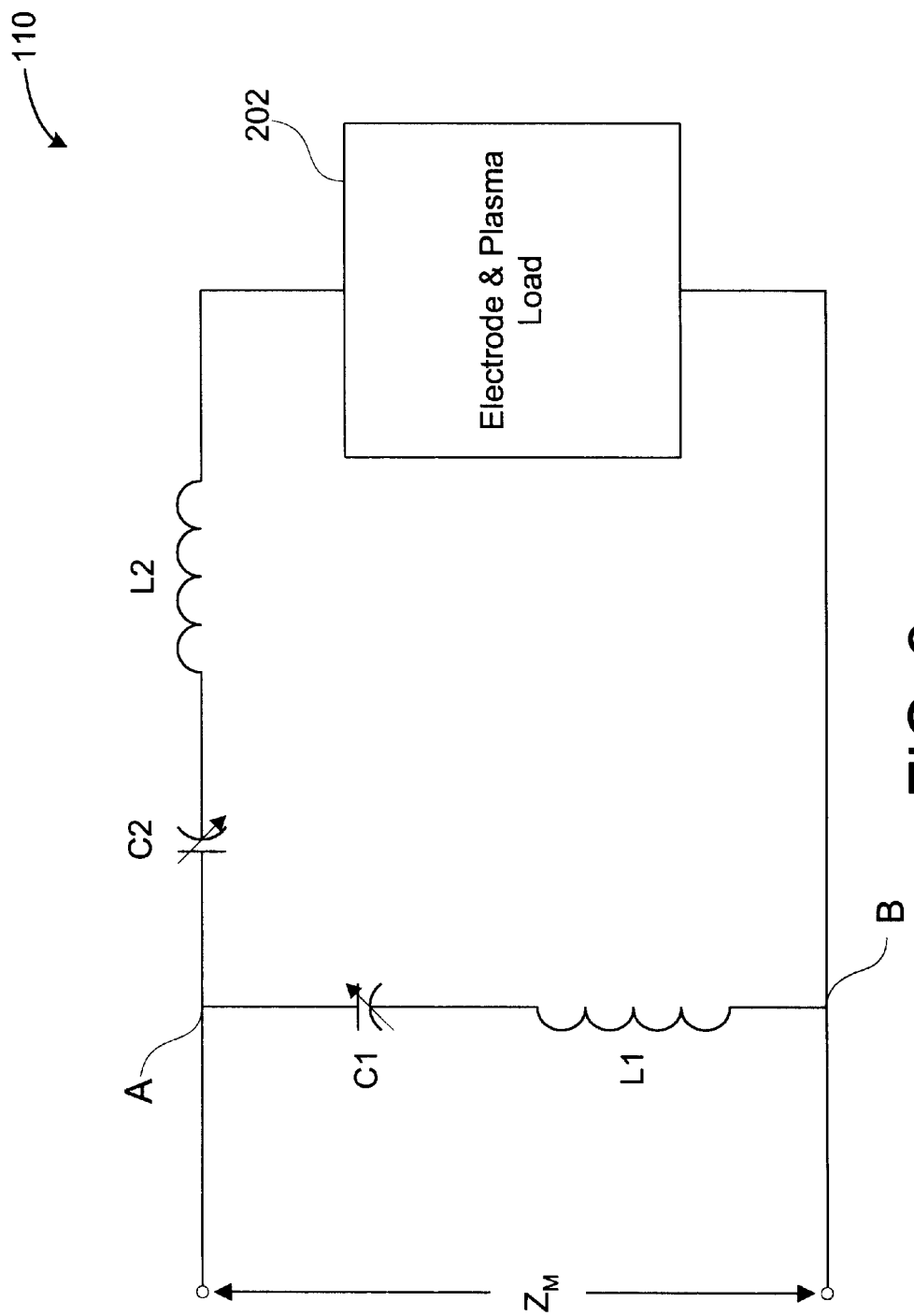
FIG. 2 shows a circuit diagram of an rf matching network coupled to an unknown load, which is equivalent to the combination of an electrostatic chuck and plasma.
Figure 3:
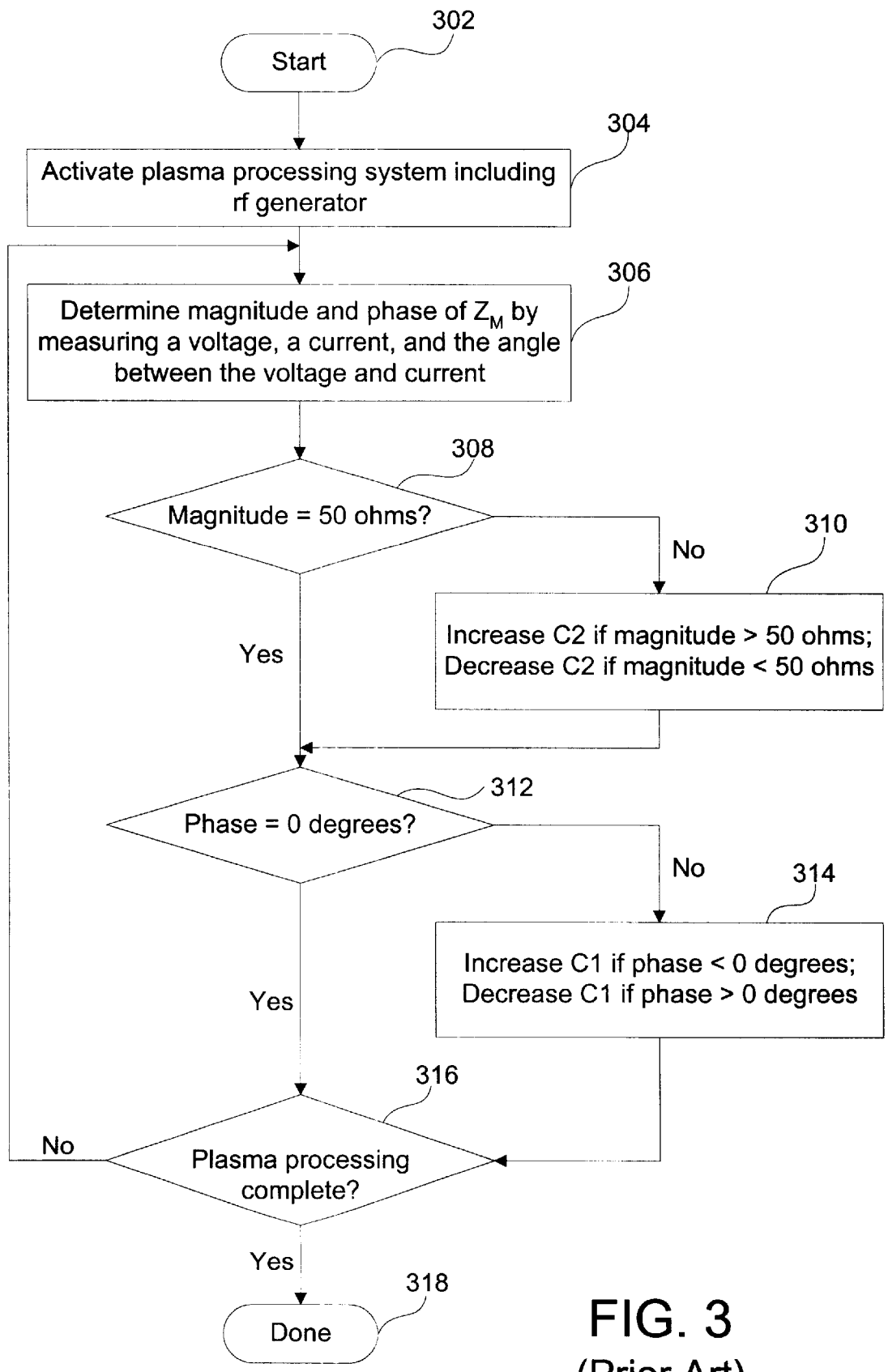
FIG. 3 illustrates a flow chart of a conventional method for tuning capacitors C1 and C2.
Figure 4A:
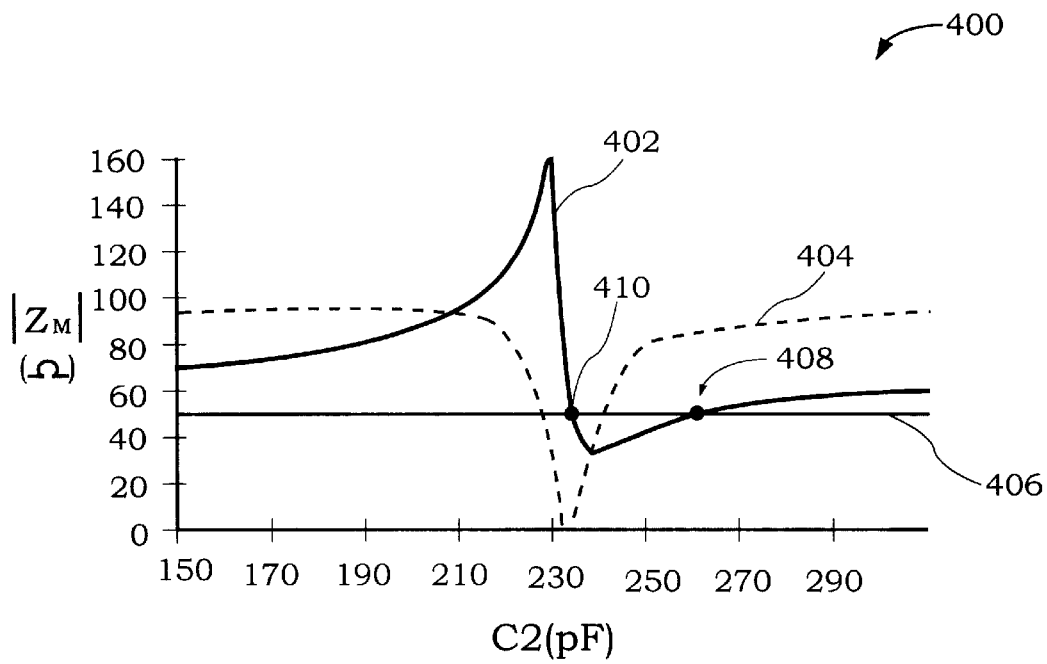
FIG. 4A illustrates an exemplary graph plotting magnitude of impedance $Z_M$ and reflected power as a function of the value of capacitor C2.
Figure 4B:
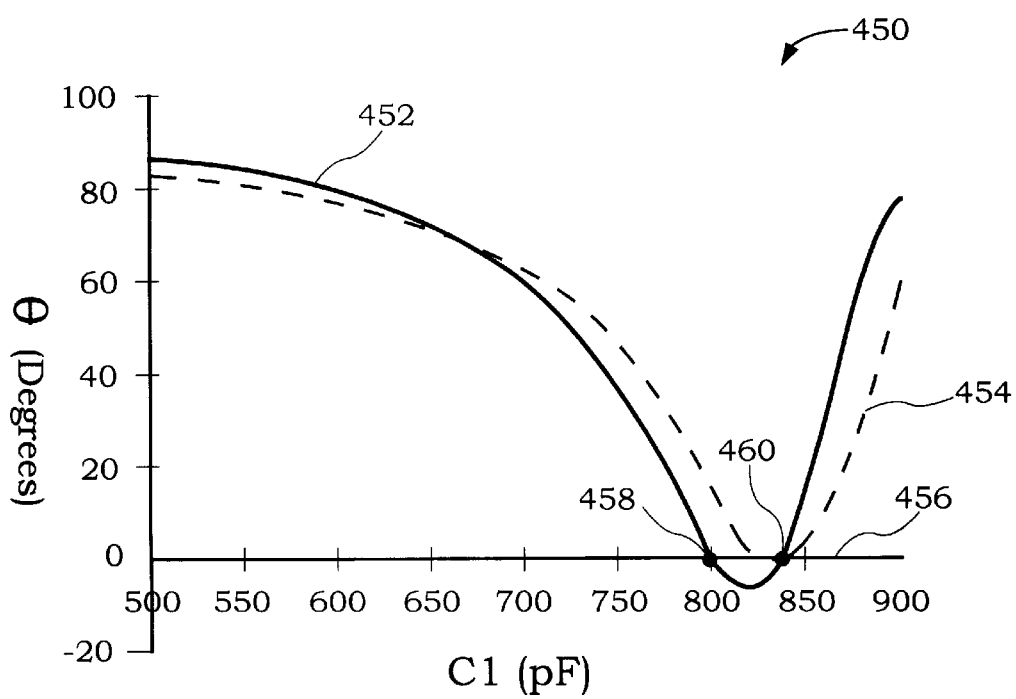
FIG. 4B shows a graph plotting the phase θ of the impedance $Z_M$ and reflected power as a function of the value of capacitor C1.

Because the prior art method of FIG. 3 is known to work well for values of the variable impedance elements that are within some distance of their tune values, the methods of the present invention may be used in conjunction with the prior art method of FIG. 3 in accordance with one aspect of the present invention. In this aspect, the new inventive method is used to adjust the values of the variable impedance until the new value of $Z_M$ satisfies some predetermined criteria, after which control of the variable tuning elements is switched to the prior art method of FIG. 3. Examples of the criteria for the switch to occur are that the ratio of reflected to incident power calculated from equation 3 be less than some predetermined value, or that the magnitude and phase of $Z_M$ fall within some predetermined range of values.

Figure 11:
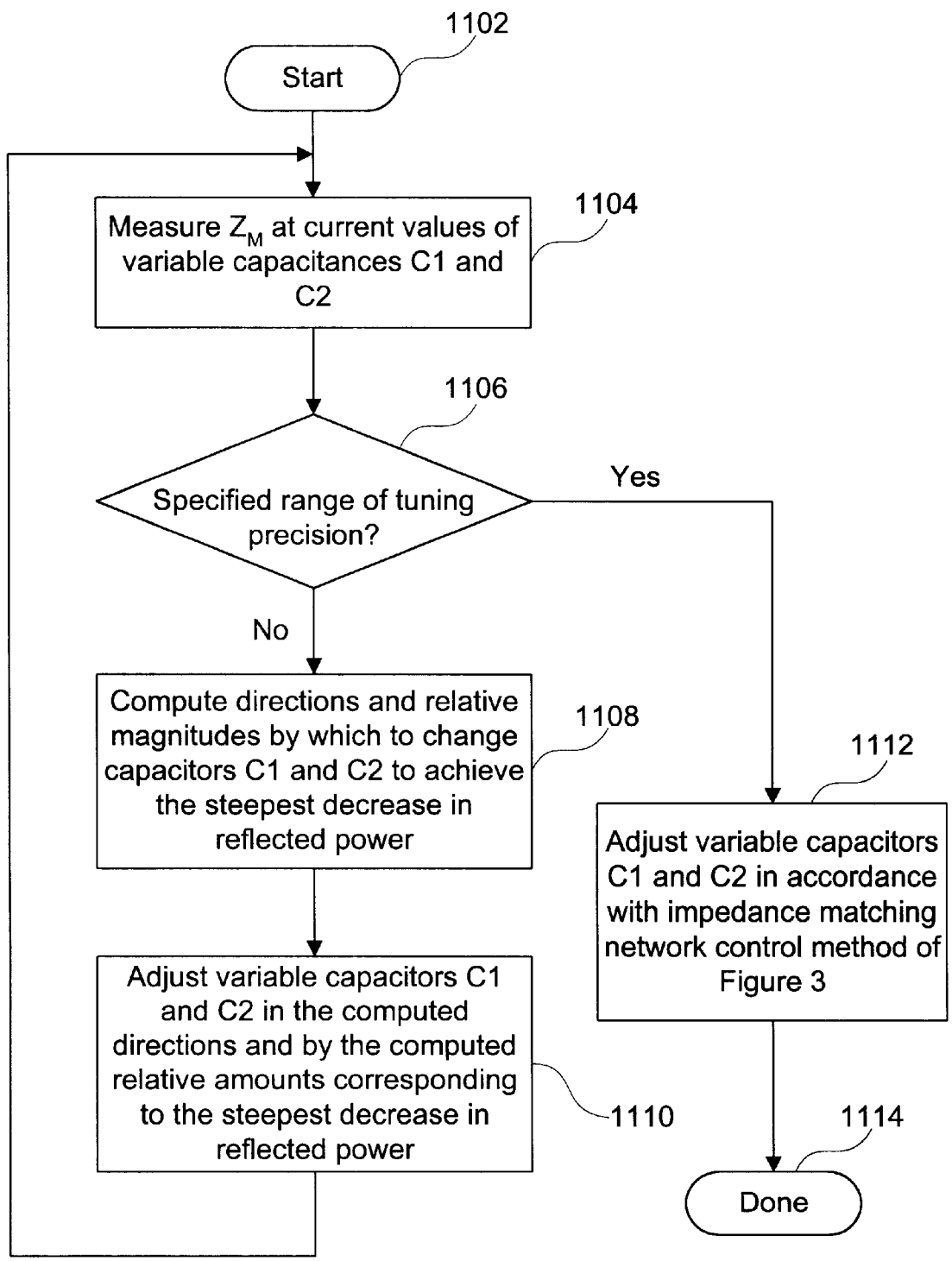
FIG. 11 illustrates a flow chart of the combined method implemented by the impedance tuning apparatus for tuning the matching network.

FIG. 11 illustrates a flow chart of an exemplary combined method implemented by the impedance tuning apparatus 510 for tuning the matching network 508. The method begins in operation 1102 and proceeds to operation 1104, where a match impedance $Z_M$ at current values of variable capacitance C1 and C2 are measured. Then in operation 1106, it is determined whether a specified tuning precision is obtained at the current values of C1 and C2 as discussed in conjunction with FIG. 7A. If so, the method proceeds to operation 1112, where the capacitors C1 and C2 are adjusted in accordance with the impedance matching network control method of FIG. 3.

If the specified tuning precision has not been obtained, the method proceeds to operation 1108, where directions and relative magnitudes by which to change capacitors C1 and C2 are computed. The direction and relative magnitudes are adapted to achieve the steepest decrease in the reflected power. Then, in operation 1110, the capacitors C1 and C2 are adjusted in the computed directions and by the computed relative amounts corresponding to the steepest decrease in the reflected power. The method then proceeds back to operation 1104, where $Z_M$ is measured at current values of C1 and C2.

The present invention thus tunes the rf matching network in the direction of the steepest decrease in the reflected power so that substantial time is saved in finding a tune point. In addition, the methods and systems of the present invention determine the direction of steepest decrease in reflected power without requiring time-consuming preliminary physical motions of the variable tuning elements. Accordingly, the methods and systems tunes the impedance matching network in an efficient and speedy manner.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for tuning an impedance matching network toward a tune point where power reflection is at a minimum, the impedance matching network being coupled between an rf generator and a load to transmit rf power to the load, the impedance matching network including a set of variable impedance elements, the method comprising:

(a) measuring a network impedance value of the impedance matching network including the load at current values of the variable impedance elements;

(b) determining directions and relative rates of change for the variable impedance element values in response to the network impedance of the network, wherein network impedance values are computed at a plurality of neighboring values of the current values of the variable impedance elements in response to an impedance of the load, wherein a set of neighboring values having the lowest reflected power among the plurality of neighboring values is selected from the plurality of neighboring values;

(c) driving the variable impedance elements by adjusting the variable impedance elements in the computed directions by the computed relative rates of change such that the variable impedance elements are driven to new current values in the direction of the selected set of neighboring values; and (d) repeating operations (a) through (c) until a desired level of tuning precision is obtained at the current values of the variable impedance elements.

2. The method as recited in claim 1, wherein the desired level of tuning precision is a specified percentage of reflected power.

3. The method as recited in claim 1, wherein the network impedance is defined in terms of a magnitude and a phase, wherein the desired level of tuning precision is a specified range of magnitude and a specified range of phase.

4. The method as recited in claim 1, wherein the operation (b) of determining the directions and relative rates of change for the variable impedance elements further comprises:

computing the impedance of the load from the network impedance value and the current values of the variable impedance elements;

computing a reflected power at each of the neighboring values in response to the associated neighboring intermediate network impedance value; and selecting neighboring values having the lowest computed reflected power from among the plurality of neighboring values of current values of the variable impedance elements; and defining the directions and the relative rates of change for the variable impedance elements as those which change the variable impedance element values from the current values toward the selected neighboring values.

5. The method as recited in claim 1, wherein the operation (b) of determining the directions and relative rates of change for the variable impedance elements further comprises:

computing an impedance of the load from the network impedance value and the values of the variable impedance elements;

defining the reflected power as a function of the variable impedance elements and of the computed load;

determining a gradient function of the reflected power as a function of the variable impedance elements; and computing the directions and relative rates of change of the variable impedance elements corresponding to a negative gradient of the gradient function, wherein the negative gradient indicates the direction toward the most rapid decrease in the reflected power.

6. The method as recited in claim 1, further comprising:

calibrating a set of motors coupled to the set of variable impedance elements so as to associate a plurality of variable impedance element values to rotation of the motors, wherein the motors are arranged to drive the impedance elements to adjust the values of the variable impedance elements.

7. The method as recited in claim 6, wherein the network impedance is defined in terms of a magnitude and a phase, wherein the method further includes:

determining the tuning precision at the current values of the variable impedance element values;

determining whether the tuning precision at the current values is within predetermined values; and if within the predetermined values, adjusting the phase and amplitude of the network impedance by increasing or decreasing the values of the variable impedance elements.

8. The method as recited in claim 1, wherein the impedance matching network is coupled to a plasma processing chamber that includes the load, wherein the load is an electrode and plasma.

9. A method for tuning an impedance matching network toward a tune point where power reflection is at a minimum, the impedance matching network being coupled between an rf generator and a load to transmit rf power to the load, the impedance matching network including a set of variable impedance elements, the method comprising:

calibrating a set of motors coupled to the set of variable impedance elements to generate a calibrated table configured to associate a plurality of variable impedance element values to rotation of the motors;

measuring a network impedance value of the impedance matching network including the load an a set of values of the variable impedance elements;

computing a load impedance in response to the network impedance value and the variable impedance element values;

determining a tune equation adapted to approximate a tune line through the tune point, the tune line including a plurality of sets of values for the variable impedance element values;

adjusting the impedance element values so as to drive the variable impedance elements to a nearest set of values on the tune line; and adjusting the impedance element values along the tune line in the direction of decreasing reflected power.

10. The method as recited in claim 9, wherein the motors are arranged to adjust the variable impedance elements.

11. The method as recited in claim 10, further comprising:

determining the tuning precision at current values of the variable impedance element values;

determining whether the tuning precision at the current values are within a predetermined values; and if within the predetermined values, adjusting the phase and amplitude of the network impedance by increasing or decreasing the values of the variable impedance elements.

12. The method as recited in claim 9, wherein the impedance matching network is coupled to a plasma processing chamber that includes the load, wherein the load is an electrode and plasma.

13. A method for tuning an impedance matching network toward a tune point where power reflection is at a minimum, the impedance matching network being coupled between an rf generator and a load to transmit rf power to the load, the impedance matching network including a set of variable impedance elements, the method comprising:

(a) measuring a network impedance value of the impedance matching network including the load at current values of the variable impedance elements;

(b) determining directions and relative rates of change for the variable impedance element values in response to the network impedance of the network, wherein a negative gradient function of the reflected power is determined as a function of the variable impedance elements;

(c) driving the variable impedance elements by adjusting the variable impedance elements in the computed directions by the computed relative rates of change such that the variable impedance elements are driven to new current values in the direction of the negative gradient function of the reflected power; and (d) repeating operations (a) through (c) until a desired level of tuning precision is obtained at the current values of the variable impedance elements.

14. The method as recited in claim 13, wherein the desired level of tuning precision is a specified percentage of reflected power.

15. The method as recited in claim 13, wherein the network impedance is defined in terms of a magnitude and a phase, wherein the desired level of tuning precision is a specified range of magnitude and a specified range of phase.

16. The method as recited in claim 13, wherein the operation (b) of determining the directions and relative rates of change for the variable impedance elements further comprises:

computing an impedance of the load from the network impedance value and the current values of the variable impedance elements;

computing network impedance values at a plurality of neighboring values of the current values of the variable impedance elements in response to the impedance of the load;

computing a reflected power at each of the neighboring values in response to the associated neighboring intermediate network impedance value; and selecting neighboring values having the lowest computed reflected power from among the plurality of neighboring values of current values of the variable impedance elements; and defining the directions and the relative rates of change for the variable impedance elements as those which change the variable impedance element values from the current values toward the selected neighboring values.

17. The method as recited in claim 13, wherein the operation (b) of determining the directions and relative rates of change for the variable impedance elements further comprises:

computing an impedance of the load from the network impedance value and the values of the variable impedance elements;

defining the reflected power as a function of the variable impedance elements and of the computed load; and computing the directions and relative rates of change of the variable impedance elements corresponding to a negative gradient of the gradient function, wherein the negative gradient indicates the direction toward the most rapid decrease in the reflected power.

18. The method as recited in claim 13, further comprising:

calibrating a set of motors coupled to the set of variable impedance elements so as to associate a plurality of variable impedance element values to rotation of the motors, wherein the motors are arranged to drive the impedance elements to adjust the values of the variable impedance elements.

19. The method as recited in claim 18, wherein the network impedance is defined in terms of a magnitude and a phase, wherein the method further includes:

determining the tuning precision at the current values of the variable impedance element values;

determining whether the tuning precision at the current values is within predetermined values; and if within the predetermined values, adjusting the phase and amplitude of the network impedance by increasing or decreasing the values of the variable impedance elements.

20. The method as recited in claim 13, wherein the impedance matching network is coupled to a plasma processing chamber that includes the load, wherein the load is an electrode and plasma.

* * * * *